United States Patent
Ronen et al.

(10) Patent No.: US 7,177,200 B2
(45) Date of Patent: Feb. 13, 2007

(54) TWO-PHASE PROGRAMMING OF A FLASH MEMORY

(75) Inventors: Amir Ronen, Ramat Hasharon (IL); Meir Avraham, Rishon Lezion (IL)

(73) Assignee: msystems Ltd., Kfar Saba (IL)

( * ) Notice: Subject to any disclaimer, the term of this patent is extended or adjusted under 35 U.S.C. 154(b) by 67 days.

(21) Appl. No.: 10/902,866

(22) Filed: Aug. 2, 2004

(65) Prior Publication Data

US 2005/0174853 A1 Aug. 11, 2005

Related U.S. Application Data

(63) Continuation-in-part of application No. 60/544,273, filed on Feb. 10, 2004.

(51) Int. Cl.
*G11C 16/04* (2006.01)

(52) U.S. Cl. .............................. 365/185.28; 365/185.29

(58) Field of Classification Search ............ 365/185.28
See application file for complete search history.

(56) References Cited

U.S. PATENT DOCUMENTS

| | | | |
|---|---|---|---|
| 5,404,485 A | 4/1995 | Ban | |
| 5,754,475 A * | 5/1998 | Bill et al. | 365/185.25 |
| 5,930,167 A | 7/1999 | Lee et al. | |
| 6,069,821 A * | 5/2000 | Jun et al. | 365/185.21 |
| 6,246,608 B1 * | 6/2001 | Odani | 365/185.2 |
| 2002/0141237 A1 * | 10/2002 | Goda et al. | 365/185.03 |
| 2004/0114434 A1 * | 6/2004 | Ishii et al. | 365/185.24 |

* cited by examiner

*Primary Examiner*—Thong Q. Le
(74) *Attorney, Agent, or Firm*—Mark M. Friedman

(57) ABSTRACT

A datum is stored in a memory by placing a memory cell in a first state that is indicative of the datum, and later placing the same or a different cell in a second state that is indicative of the same datum. If a different cell is placed in the second state, both cells are programmed to store the same number of bits, and then preferably the first cell is erased. Preferably, the first cell is placed in the first state by the application thereto of a first train of voltage pulses until the cell's threshold voltage exceeds a first reference voltage, and the first or second cell is placed in the second state by the application thereto of a second train of voltage pulses until the cell's threshold voltage exceeds a second reference voltage.

18 Claims, 4 Drawing Sheets

TWO-PHASE PROGRAMMING OF A FLASH MEMORY

This is a continuation-in-part of U.S. Provisional Patent Application No. 60/544,273, filed Feb. 10, 2004.

FIELD AND BACKGROUND OF THE INVENTION

The present invention relates to flash memories and, more particularly, to a method of increasing the effective programming speed of a flash memory with no loss in reliability.

FIG. 1 illustrates the storage of a bit, either a zero bit or a one bit, in a cell of an electrically programmable memory (EPROM) such as a flash memory. For historical reasons, this process of storing data in a EPROM is called "programming" the EPROM. Specifically, the cell that is the subject of FIG. 1 is a single-level cell (SLC). Initially, the cell has a nominal threshold voltage $V_1$ that represents a one bit. For example, after a block of a flash memory has been erased, all the cells have nominal threshold voltages $V_1$. Because of unavoidable inaccuracies in the initializations of the cells, the actual threshold voltages are distributed around the nominal threshold voltage $V_1$ according to a distribution curve 10. Then, to each cell that is to store a zero bit, a train of programming voltage pulses is applied, in order to inject electrons from the cell's silicon substrate through the cell's oxide layer into the cell's floating gate, until the cell's threshold voltage exceeds a reference voltage $V_0$ that represents a zero bit. Because the electrons move through the oxide layer by quantum mechanical tunneling or by hot injection, because of non-uniformities in the cells' structures, and because the initial threshold voltages are distributed according to distribution curve 10, the threshold voltages of the cells that store zero bits are distributed above $V_0$ according to a distribution curve 12.

A cell is read by comparing the cell's threshold voltage to a reference voltage $V_R$ that is above distribution curve 10 but below $V_0$. If the cell's threshold voltage is below $V_R$ then the cell's contents are read as a one bit. If the cell's threshold voltage is at or above $V_R$ then the cell's contents are read as a zero bit.

Over time, the threshold voltages of the cells that store zero bits tend to drift downwards. Also shown in FIG. 1, in phantom, is a distribution curve 14 that represents the distribution of the threshold voltages of the cells that have been programmed to store zero bits after the passage of a considerable amount of time. $V_1$, $V_R$ and $V_0$ are selected to be sufficiently far apart to preserve the reliability of the flash memory despite this drift of the threshold voltages.

The voltage difference between the successive voltage pulses that are used to program a cell are relatively small, for two reasons. In the illustrated case of a SLC, and in the case of the highest voltage band of a multi-level cell (MLC, in which each of $2^n$ voltage bands corresponds to one of the $2^n$ possible patterns of n bits), too high a programming voltage imposes stress on the cell that reduces the cell's useful lifetime. In the case of the intermediate voltage bands of an MLC, distribution 12 must be sufficiently narrow to fit within the voltage band that represents the corresponding bit pattern. The use of small voltage increments implies that the programming of an array of flash cells is a relatively slow process. There is thus a widely recognized need for, and it would be highly advantageous to have, a method of programming flash memory cells that is faster than the presently known methods, with no loss in reliability.

SUMMARY OF THE INVENTION

According to the present invention there is provided a method of storing a datum in a memory, including the steps of: (a) placing a cell of the memory in a first state that is indicative of the datum; and (b) placing the cell in a second state that is indicative of the datum, the second state having a longer data retention time than the first state.

According to the present invention there is provided a memory device including: (a) at least one cell; and (b) a controller operative: (i) to place one of the at least one cell in a first state that is indicative of a datum, and (ii) to place the one cell in a second state that is indicative of the datum, the second state having a longer data retention time than the first state.

According to the present invention there is provided a method of storing a datum in a memory that includes a plurality of cells, the method including the steps of: (a) placing a first cell of the memory in a first state that is indicative of the datum; and (b) placing a second cell of the memory in a second state that is indicative of the datum, the second state having a longer data retention time than the first state; wherein the first cell and the second cell store an identical number of bits.

According to the present invention there is provided a memory device including: (a) an array of cells; and (b) a controller operative: (i) to place a first of the cells in a first state that is indicative of a datum, and (ii) to place a second of the cells in a second state that is indicative of the datum, the second state having a longer data retention time than the first state wherein the first cell and the second cell store an identical number of bits.

According to the present invention there is provided a method of operating a memory that includes a plurality of cells, including the steps of: (a) for each of at least one of the cells: (i) comparing a threshold voltage of the each cell to a first reference voltage that is indicative of a certain bit pattern, and (ii) comparing the threshold voltage of the each cell to a second reference voltage that is greater than the first reference voltage and that also is indicative of the bit pattern; and (b) for each at least one cell, if the comparing shows that the threshold voltage of the each cell is between the first reference voltage and the second reference voltage: applying at least one voltage pulse to the each cell until the threshold voltage of the each cell is greater than the second reference voltage.

According to the present invention there is provided a memory device including: (a) at least one cell; and (b) a controller operative, for each at least one cell for which a comparison of a threshold voltage of the each cell to a first reference voltage that is indicative of a certain bit pattern and to a second reference voltage that is indicative of said bit pattern shows that the threshold voltage of the each cell is between the first reference voltage and the second reference voltage: to apply at least one voltage pulse to the each cell until the threshold voltage of the each cell is greater than the second reference voltage.

According to the present invention there is provided a method of operating a memory that includes a plurality of cells, including the steps of: (a) for each of at least one of the cells: (i) comparing a threshold voltage of the each cell to a first reference voltage that is indicative of a certain bit pattern, and (ii) comparing the threshold voltage of the each cell to a second reference voltage that is greater than the first reference voltage and that also is indicative of the bit pattern; and (b) for each at least one cell, if the comparing shows that the threshold voltage of the each cell is between the first reference voltage and the second reference voltage: applying at least one voltage pulse to a corresponding other cell until a threshold voltage of the corresponding other cell is greater than the second reference voltage.

According to the present invention there is provided a memory device including: (a) an array of cells; and (b) a controller operative, for each cell of the array for which a comparison of a threshold voltage of the each cell to a first reference voltage that is indicative of a certain bit pattern and to a second reference voltage that is indicative of said bit pattern shows that the threshold voltage of the each cell is between the first reference voltage and the second reference voltage: to apply at least one voltage pulse to a corresponding other cell of the array until a threshold voltage of the corresponding other cell is greater than the second reference voltage.

The present invention is a method of storing data in a memory such as a flash memory. Although the description herein is directed at flash memories, the scope of the present invention includes any memory, such as an EPROM, that is programmed by placing cells of the memory in respective states that are indicative of the data stored therein, for example by using trains of programming voltage pulses.

In each cell of the memory is stored a "datum". A "datum" is a string of one or more bits that is stored in the cell by a host. How many bits are stored per cell depends on how the memory is configured. SLC cells store one bit per cell. MLCs store more than one bit per cell. Although the present invention is described herein in terms of SLCs, the scope of the present invention extends to MLCs. Indeed, the present invention probably is more significant for MLCs than for SLCs because the programming of a MLC generally takes longer than the programming of a SLC. It will be clear to those skilled in the art how to apply the principles of the present invention to the programming of MLCs.

More specifically, as noted above, a SLC in its unprogrammed state conventionally is interpreted as storing a one bit. Similarly, a MLC in its unprogrammed state conventionally is interpreted as storing a string of one bits. The methods of the present invention are methods of programming memory cells to store data that are not one bits (SLCs) or strings of one bits (MLCs).

According to a first basic method of the present invention, a memory cell is programmed to store a datum by placing the cell in a first state that is indicative of the datum. Then the cell is placed in a second state that also is indicative of the datum. That a cell is in a state that is "indicative" of a datum means that, according to a test of a physical property of the cell, such as the cell's threshold voltage, the cell is interpreted as storing that datum. The datum is a logical datum that is received from a host and has a specific meaning to the host. Both the first state and the second state indicate the same information with the same meaning to the host. So, for example, the scope of the present invention specifically excludes, for example, programming a SLC to store a zero bit from one of the host's data sets, erasing the SLC, and then again programming the SLC to store a zero bit from another one of the host's data sets.

Preferably, the cell is placed in the first state by steps including applying a first train of one or more programming voltage pulses to the cell until the cell's threshold voltage exceeds a first reference voltage. Similarly, the cell is placed in the second state by steps including applying a second train of one or more programming voltage pulses until the cell's threshold voltage exceeds a second, different reference voltage. Most preferably, the second reference voltage is greater than the first reference voltage.

More preferably, the first train of programming voltage pulses includes a monotonically increasing plurality of the voltage pulses, and the second train of programming voltage pulses also includes a monotonically increasing plurality of the voltage pulses. Most preferably, successive voltage pulses of the first train differ by a first common increment (voltage step size), and successive voltage pulses of the second train differ by a second common increment that is less than the first common increment.

More generally, the cell that is placed in the second state need not be the same as the cell that is placed in the first state. According to a second basic method of the present invention, a first memory cell is programmed to store a datum by placing the first cell in a first state that is indicative of the datum. Then a second, different memory cell is programmed to store the same datum by placing the second cell in a second state that is indicative of the datum. Both cells are programmed to store the same number of bits. The latter limitation distinguishes the present invention from Lee et al., U.S. Pat. No. 5,930,167, who initially store data in SLCs and then compress the same data into MLCs.

Preferably, the first cell then is erased.

Preferably, the first cell is placed in the first state by applying a first train of one or more programming voltage pulses to the first cell until the first cell's threshold voltage exceeds a first reference voltage. Similarly, the second cell is placed in the second state by applying a train of one or more programming voltage pulses to the second cell until the threshold voltage of the second cell exceeds a second, different reference voltage. Most preferably, the second reference voltage is greater than the first reference voltage.

More preferably, the first train of programming voltage pulses includes a monotonically increasing plurality of the voltage pulses, and the second train of programming voltage pulses also includes a monotonically increasing plurality of the voltage pulses. Most preferably, successive voltage pulses of the first train differ by a first common increment (voltage step size), and successive voltage pulses of the second train differ by a second common increment that is less than the first common increment.

A third basic method of the present invention is useful in recovering from interruptions of the first two methods by losses of power, and also is useful for reversing the drift over time of threshold voltages that is illustrated in FIG. 1. This method is a method of operating a memory that includes a plurality of memory cells. According to this method, the threshold voltages of one or more of the cells are compared to a first reference voltage and to a second, greater reference voltage, both reference voltages being indicative of the same bit pattern. (That a reference voltage is "indicative" of a bit pattern means that the reference voltage is the lower bound of a voltage band such that if the cell's threshold voltage is within that voltage band then the cell is interpreted as storing that bit pattern. For example, the reference voltages $V_R$ and $V_O$ of FIG. 1 are indicative of the bit pattern "0", because if a comparison of the threshold voltage of the cell to $V_R$ or to $V_O$ shows that the threshold voltage of the cell exceeds that reference voltage then the cell is interpreted as storing a zero bit. Similarly, the reference voltages of a four-level MLC could be indicative of the bit patterns "10", "01" or "00".) For each cell whose threshold voltage is between the two reference voltages, a train of at least one programming voltage pulse is applied either to the same cell or to a corresponding other cell (typically an unprogrammed or freshly erased cell) until the threshold voltage of the cell to which the train of programming voltage(s) is applied exceeds the second reference voltage. If the train of programming voltage(s) is applied to a corresponding other cell, then preferably the cell whose threshold voltage was found to be between the two reference voltages is erased.

The scope of the present invention also includes memory devices that operate according to the methods of the present invention.

BRIEF DESCRIPTION OF THE DRAWINGS

The invention is herein described, by way of example only, with reference to the accompanying drawings, wherein.

DESCRIPTION OF THE PREFERRED EMBODIMENTS

The present invention is of a method of programming a memory such as a flash memory, at an effective speed greater than that of prior art methods, with no loss in reliability.

The principles and operation of memory programming according to the present invention may be better understood with reference to the drawings and the accompanying description.

The present invention takes advantage of the fact that a host of a memory device such as a flash memory device typically exchanges data with the memory device only intermittently. For example, in the case of a digital camera with a detachable flash memory device, the user of the camera rarely if ever takes pictures at such a fast rate that the camera is continuously engaged in writing acquired digital images to the flash memory device. Nevertheless, a photographer sometimes desires to take a small number of pictures in quick succession, with the delay between successive pictures being as short as possible. This mandates that the flash cells that store the pictures be programmed as fast as possible. The basic idea of the present invention is to program the flash memory of the flash memory device in a quick and dirty manner that produces relatively broad threshold voltage distributions that would render the flash memory unreliable in the long term if left uncorrected. Then, while the host of the flash memory device is idle, the flash memory device shifts and tightens up its threshold voltage distributions sufficiently to obtain long-term reliability.

Figure 1:
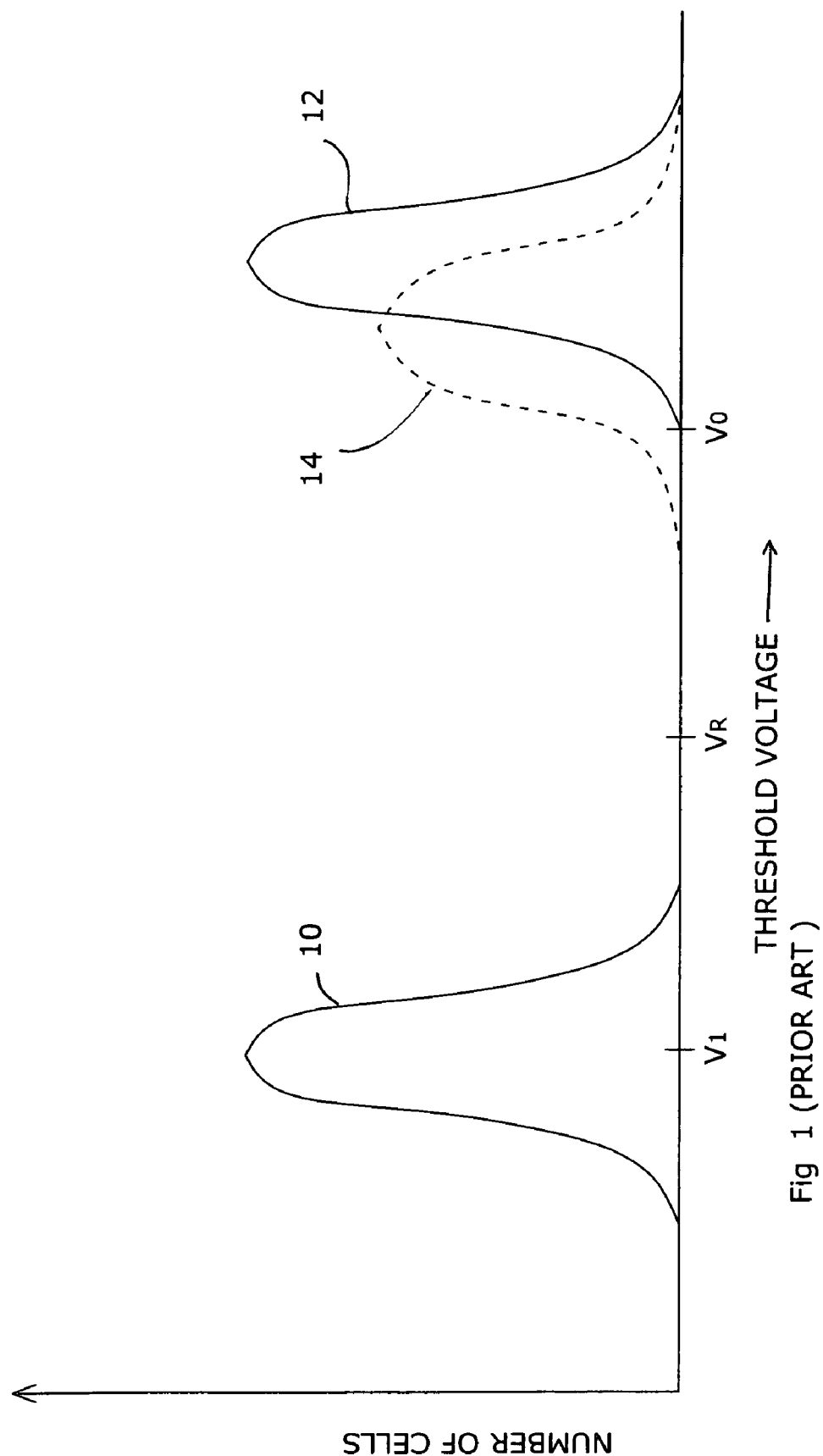
FIG. 1 illustrates the storage of a datum bit in an EPROM cell according to the prior art.
Figure 2:
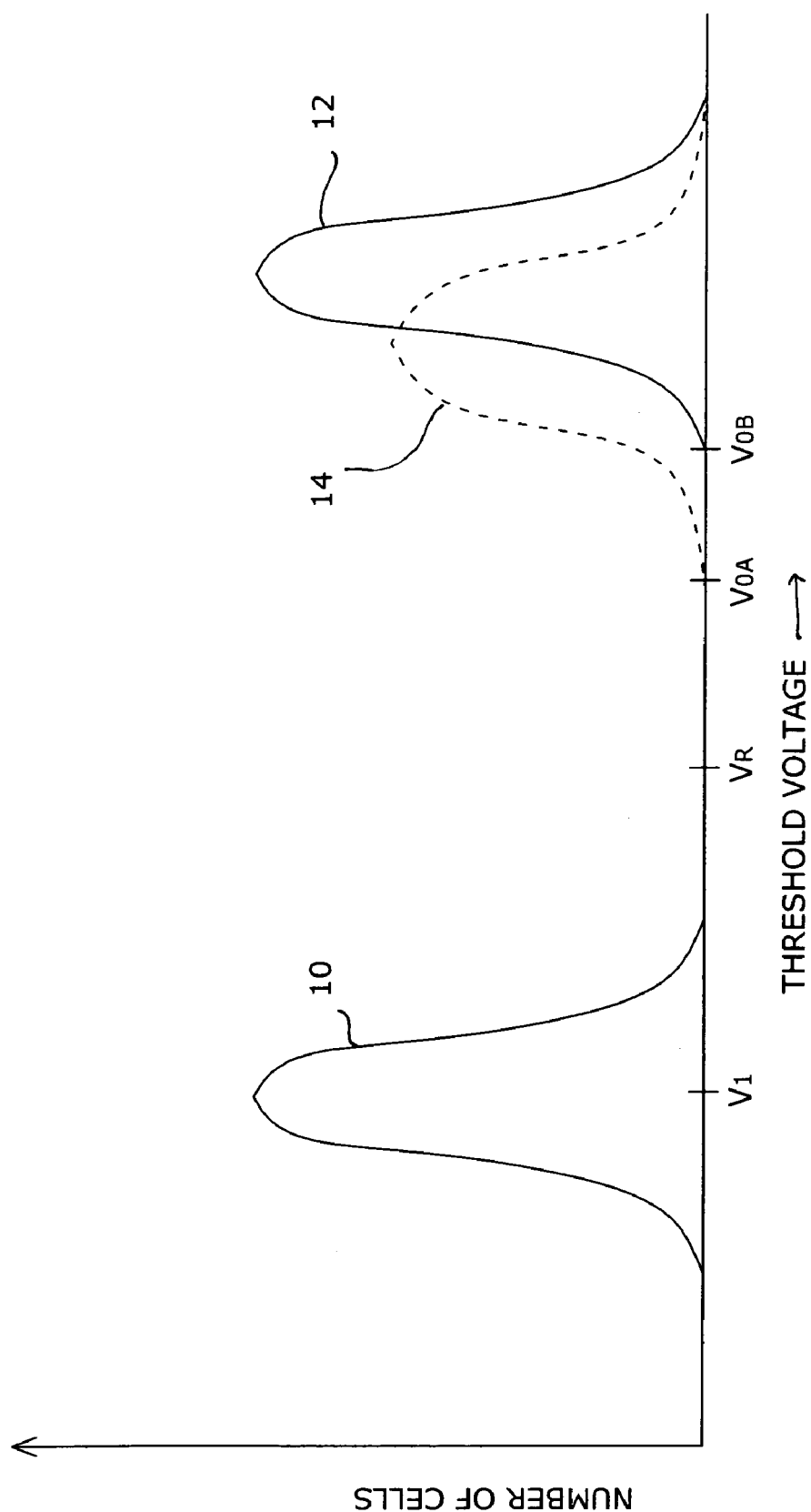
FIG. 2 illustrates the storage of a datum bit in an EPROM cell according to the present invention.

Referring again to the drawings, FIG. 2 is FIG. 1 modified according to the principles of the present invention. FIG. 2 is identical to FIG. 1, but with reference voltage $V_0$ relabeled as "$V_{OB}$" and with a new reference voltage, $V_{OA}$, introduced at the left end of distribution 14.

A SLC flash memory device of the present invention has two programming modes. The first mode is identical to the prior art mode. The second mode is a fast programming mode in which a first train of programming voltage pulses is applied to each cell that is to store a zero bit only until the cell's threshold voltage exceeds $V_{OA}$. In this manner, the cells that need to be programmed are programmed faster than in the prior art, under which the first train of programming voltage pulses would be applied to each cell that is to store a zero bit until the cell's threshold voltage exceeds $V_{OB}$. Note that because $V_{OA}>V_R$, every cell whose threshold voltage exceeds $V_{OA}$ is read correctly as storing a zero bit. Later, while the host of the flash memory device is idle (i.e.,  not exchanging data with the flash memory device) (but not so much later that a threshold voltage just above $V_{OA}$ could have drifted below $V_R$), the on-board controller of the flash memory device reads the cells that were programmed in fast programming mode. For every cell that stores a zero bit (according to the comparison to $V_R$), the cell's threshold voltage is compared to $V_{OB}$. If the cell's threshold voltage is below $V_{OB}$, then a second train of programming voltage pulses is applied to the cell to raise the cell's threshold voltage above $V_{OB}$.

The voltage step size of the second train of programming voltage pulses is the same as the prior art step size. To make the fast programming mode even faster, the voltage step size of the first train of programming voltage pulses is made greater than the prior art step size. This results in a wider distribution of programmed threshold voltages than according to the prior art. For example, as illustrated in FIG. 2, the resulting distribution of threshold voltages could resemble distribution 14 that results from the downward drift over time of prior art distribution 12. This unnecessarily wide distribution is tightened in the second phase of the fast programming mode, in which the second trains of programming voltage pulses are applied to cells as needed to raise the cells' threshold voltages above $V_{OB}$. The resulting threshold voltage distribution resembles distribution 12, as illustrated in FIG. 2.

Some flash technologies have restrictions, for example restrictions on partial page programming or restrictions on non-sequential page writing, that prevent the application of the second trains of programming voltage pulses to cells that have been programmed using the first trains of programming voltage pulses. In a flash memory device that uses such a flash technology, the cells that were programmed using the first trains of programming voltage pulses are copied to fresh (never-programmed or newly erased) flash cells using the prior art method and so inherently producing threshold voltage distribution 12. Note that this copying operation stores as many bits per new cell (one bit per cell in the present example) as were stored in the cells that are being copied. As noted above, this aspect of the present invention distinguishes the present invention from the teachings of U.S. Pat. No. 5,930,167.

A flash memory device of the present invention may experience a loss of power between the first and second phases of the fast programming mode. Therefore, on power-up, the flash memory device always enters the second phase of the fast programming mode, to make sure that any cell whose threshold voltages should have been raised above $V_{OB}$ is in fact raised above $V_{OB}$. This method of power-up has the additional benefit that threshold voltages that were programmed correctly to be above $V_{OB}$ but that meanwhile have drifted below $V_{OB}$ are raised back up above $V_{OB}$. Long-term downward drift of threshold voltages thus is eliminated as a limit on the useful data retention time of a flash memory device.

Figure 3:
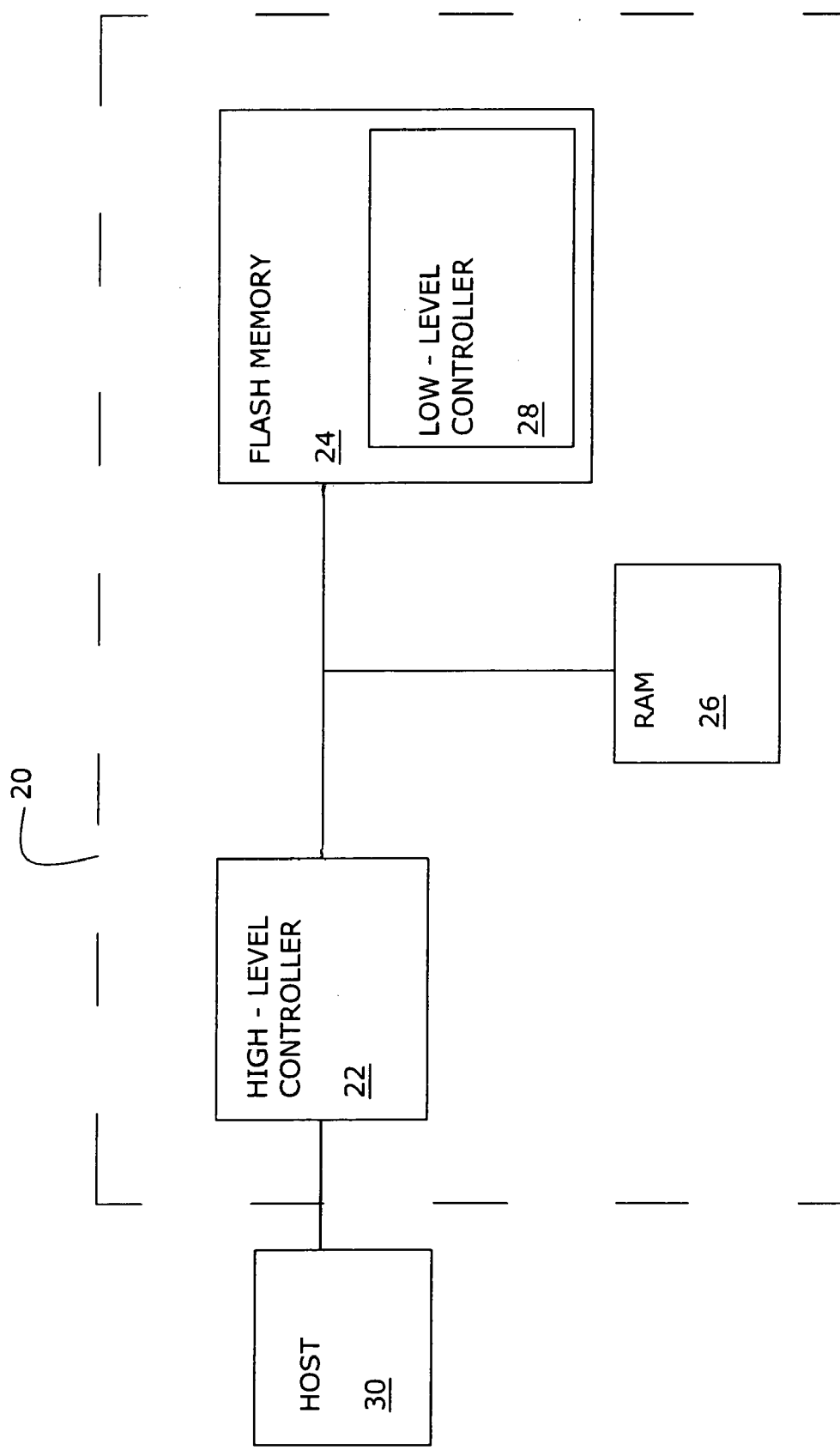
FIGS. 3 and 4 are high-level block diagrams of memory devices of the present invention.

FIG. 3 is a high-level block diagram of a memory device 20 of the present invention, coupled to a host 30. FIG. 3 is adapted from FIG. 1 of Ban, U.S. Pat. No. 5,404,485, which patent is incorporated by reference for all purposes as if fully set forth herein. Memory device 20 includes a flash memory 24, a high-level controller 22 and a random access memory (RAM) 26. High-level controller 22, that corresponds to "flash control 14" of U.S. Pat. No. 5,404,485, manages flash memory 24, with the help of RAM 26, as described in U.S. Pat. No. 5,404,485. Flash memory 24 includes a low-level controller 28 that translates the commands received from high-level controller 22 into hardware-level commands. For example, low-level controller 28 translates the command to program a cell into a train of voltage pulses, selects the threshold voltage, etc. Low-level controller 28 supports two different kinds of programming commands, corresponding to the two programming modes of the present invention, a slow (prior art) programming mode and a fast programming mode, as described above. The "controller" that is recited in the appended claims is such a low-level controller.

Figure 4:
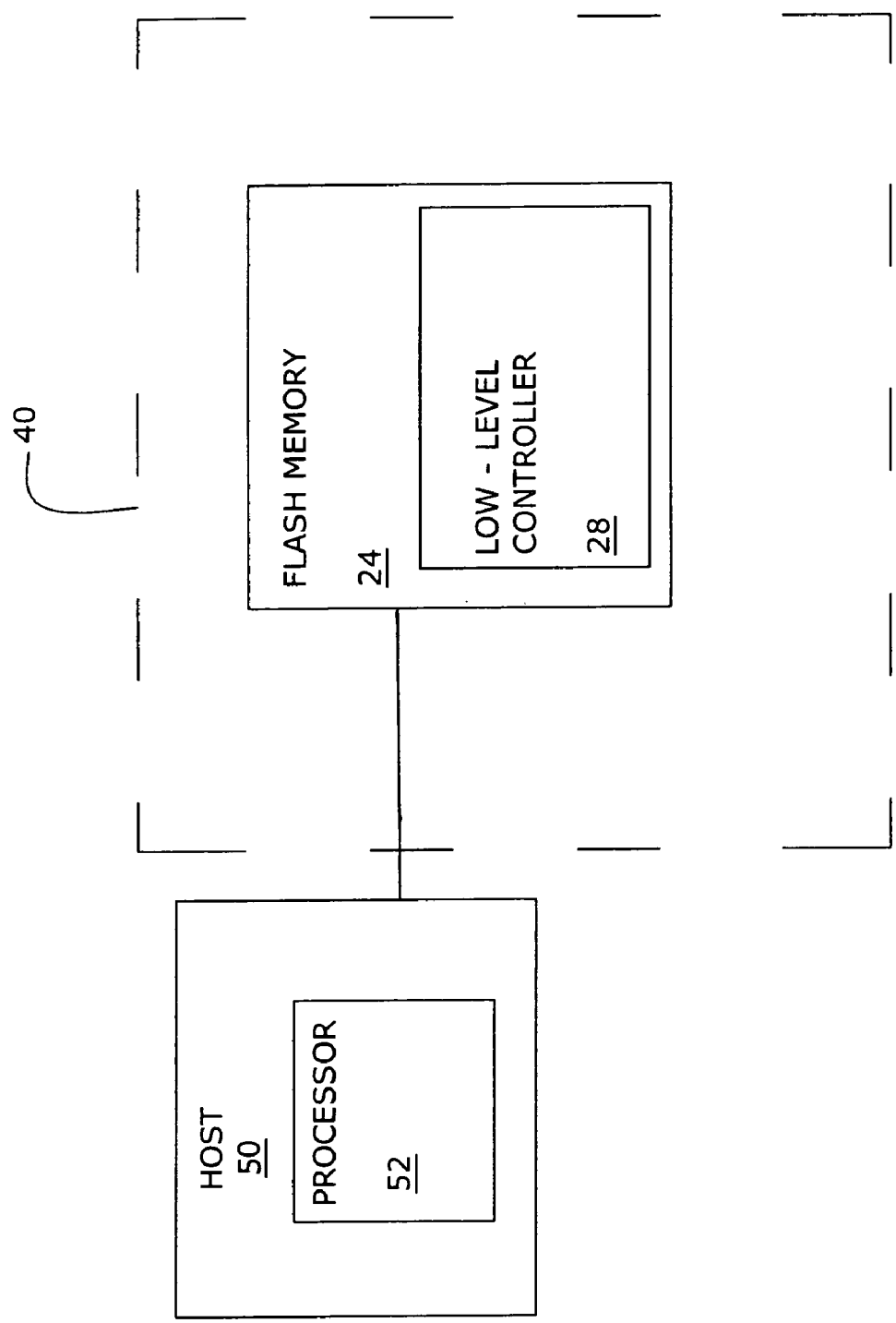

FIG. 4 is a high-level block diagram of another memory device 40 of the present invention, coupled to a host 50. In the embodiment of FIG. 4, memory device 40 includes, from among the components of flash memory 20 that are illustrated in FIG. 3, only flash memory 24 with low-level controller 28. Processor 52 of host 50 emulates controller 22 by executing a software driver, such as the TrueFFS™ driver of M-Systems Flash Disk Pioneers Ltd. of Kfar Saba, Israel, that implements the methodology of U.S. Pat. No. 5,404,485.

While the invention has been described with respect to a limited number of embodiments, it will be appreciated that many variations, modifications and other applications of the invention may be made.

What is claimed is:

1. A method of storing a datum in a memory, comprising the steps of:
    (a) placing a cell of the memory in a first state that is indicative of the datum; and
    (b) placing said cell in a second state that is indicative of the datum, said second state having a longer data retention time than said first state.

2. The method of claim 1, wherein said cell is placed in said first state by steps including applying at least one first voltage pulse to said cell until a threshold voltage of said cell exceeds a first reference voltage that is indicative of the datum; and wherein said cell is placed in said second state by steps including applying at least one second voltage pulse to said cell until said threshold voltage of said cell exceeds a second reference voltage that is indicative of the datum, said second reference voltage being different from said first reference voltage.

3. The method of claim 2, wherein said second reference voltage is greater than said first reference voltage.

4. The method of claim 2, wherein a monotonically increasing plurality of said first voltage pulses are applied to said cell and then a monotonically increasing plurality of said second voltage pulses are applied to said cell.

5. The method of claim 4, wherein successive said first voltage pulses differ by a common first increment, wherein successive said second voltage pulses differ by a common second increment, and wherein said second increment is less than said first increment.

6. A memory device comprising:
    (a) at least one cell; and
    (b) a controller operative:
        (i) to place one of said at least one cell in a first state that is indicative of a datum, and
        (ii) to place said one cell in a second state that is indicative of said datum, said second state having a longer data retention time than said first state.

7. A method of storing a datum in a memory that includes a plurality of cells, the method comprising the steps of:
    (a) placing a first cell of the memory in a first state that is indicative of the datum; and
    (b) placing a second cell of the memory in a second state that is indicative of the datum, said second state having a longer data retention time than said first state;
wherein said first cell and said second cell then store an identical number of bits.

8. The method of claim 7, further comprising the step of:
    (c) erasing said first cell.

9. The method of claim 7, wherein said first cell is placed in said first state by steps including applying at least one first voltage pulse to said first cell until a threshold voltage of said first cell exceeds a first reference voltage that is indicative of the datum; and wherein said second cell is placed in said second state by steps including applying at least one second voltage pulse to said second cell until a threshold voltage of said second cell exceeds a second reference voltage that is indicative of the datum.

10. The method of claim 9, wherein said second reference voltage is greater than said first reference voltage.

11. The method of claim 9, wherein a monotonically increasing plurality of said first voltage pulses are applied to said first cell and a monotonically increasing plurality of said second voltage pulses are applied to said second cell.

12. The method of claim 11, wherein successive said first voltage pulses differ by a common first increment, wherein successive said second voltage pulses differ by a common second increment, and wherein said second increment is less than said first increment.

13. A memory device comprising:
    (a) an array of cells; and
    (b) a controller operative:
        (i) to place a first of said cells in a first state that is indicative of a datum, and
        (ii) to place a second of said cells in a second state that is indicative of said datum, said second state having a longer data retention time than said first state,
    wherein said first cell and said second cell then store an identical number of bits.

14. A method of operating a memory that includes a plurality of cells, comprising the steps of:
    (a) for each of at least one of the cells:
        (i) comparing a threshold voltage of said each cell to a first reference voltage that is indicative of a certain bit pattern, and
        (ii) comparing said threshold voltage of said each cell to a second reference voltage that is greater than said first reference voltage and that also is indicative of said bit pattern; and
    (b) for each said at least one cell, if said comparing shows that said threshold voltage of said each cell is between said first reference voltage and said second reference voltage: applying at least one voltage pulse to said each cell until said threshold voltage of said each cell is greater than said second reference voltage.

15. A memory device comprising:
    (a) at least one cell; and
    (b) a controller operative, for each said at least one cell for which a comparison of a threshold voltage of said each cell to a first reference voltage that is indicative of a certain bit pattern and to a second reference voltage that is indicative of said bit pattern shows that said threshold voltage of said each cell is between said first reference voltage and said second reference voltage: to apply at least one voltage pulse to said each cell until said threshold voltage of said each cell is greater than said second reference voltage.

16. A method of operating a memory that includes a plurality of cells, comprising the steps of:
  (a) for each of at least one of the cells:
    (i) comparing a threshold voltage of said each cell to a first reference voltage that is indicative of a certain bit pattern, and
    (ii) comparing said threshold voltage of said each cell to a second reference voltage that is greater than said first reference voltage and that also is indicative of said bit pattern; and
  (b) for each said at least one cell, if said comparing shows that said threshold voltage of said each cell is between said first reference voltage and said second reference voltage: applying at least one voltage pulse to a corresponding other cell until a threshold voltage of said corresponding other cell is greater than said second reference voltage.

17. The method of claim 16, further comprising the step of:
  (c) for each said at least one cell for which said comparing shows that said threshold voltage is greater than said first reference voltage and less than said second reference voltage: subsequent to said applying of said at least one voltage pulse to said corresponding other cell until said threshold voltage of said corresponding other cell is greater than said second reference voltage: erasing said each cell.

18. A memory device comprising:
  (a) an array of cells; and
  (b) a controller operative, for each said cell of said array for which a comparison of a threshold voltage of said each cell to a first reference voltage that is indicative of a certain bit pattern and to a second reference voltage that is indicative of said bit pattern shows that said threshold voltage of said each cell is between said first reference voltage and said second reference voltage: to apply at least one voltage pulse to a corresponding other cell of said array until a threshold voltage of said corresponding other cell is greater than said second reference voltage.

* * * * *